(12) United States Patent
Hara et al.

(10) Patent No.: US 11,345,820 B2
(45) Date of Patent: *May 31, 2022

(54) HOLLOW PARTICLES AND PRODUCTION METHOD THEREFOR, AND WHITE INK

(71) Applicant: Nippon Kayaku Kabushiki Kaisha, Tokyo (JP)

(72) Inventors: Yukihiro Hara, Tokyo (JP); Akihiro Nohara, Tokyo (JP)

(73) Assignee: Nippon Kayaku Kabushiki Kaisha, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/763,506

(22) PCT Filed: Dec. 10, 2018

(86) PCT No.: PCT/JP2018/045279
§ 371 (c)(1),
(2) Date: May 12, 2020

(87) PCT Pub. No.: WO2019/117075
PCT Pub. Date: Jun. 20, 2019

(65) Prior Publication Data
US 2020/0339817 A1    Oct. 29, 2020

(30) Foreign Application Priority Data
Dec. 11, 2017   (JP) .............................. JP2017-236677

(51) Int. Cl.
*C09C 1/00* (2006.01)
*B01J 13/04* (2006.01)
(Continued)

(52) U.S. Cl.
CPC ............. *C09C 1/0087* (2013.01); *B01J 13/04* (2013.01); *B01J 13/203* (2013.01); *B01J 13/206* (2013.01);
(Continued)

(58) Field of Classification Search
None
See application file for complete search history.

(56) References Cited

U.S. PATENT DOCUMENTS

| 6,358,495 | B1 | 3/2002 | Nishihama et al. |
| 2005/0191441 | A1* | 9/2005 | Yamamoto ............ B41M 5/502 428/32.24 |

(Continued)

FOREIGN PATENT DOCUMENTS

| CN | 101259402 A | 9/2008 |
| CN | 103359782 A | 10/2013 |

(Continued)

OTHER PUBLICATIONS

Machine translation JP2017-114721 (Year: 2017).*

(Continued)

*Primary Examiner* — Alexandre F Ferre
(74) *Attorney, Agent, or Firm* — Knobbe Martens Olson & Bear LLP (57) ABSTRACT

Hollow particles containing monocrystalline titanium oxide and silica, and having a titanium oxide content of 86.0-99.5 mol % and a silica content of 0.5-14.0 mol %; and a method of producing the particles. A white ink containing the hollow particles as a coloring agent; the use of the white ink in inkjet recording; and a method for inkjet recording using the white ink.

13 Claims, 7 Drawing Sheets

(51) Int. Cl.
*B01J 13/20* (2006.01)
*C09D 11/322* (2014.01)
*C09D 11/037* (2014.01)

(52) U.S. Cl.
CPC .......... *C09D 11/037* (2013.01); *C09D 11/322* (2013.01); *C01P 2004/04* (2013.01); *C01P 2004/34* (2013.01); *C01P 2004/61* (2013.01); *C01P 2004/62* (2013.01); *C01P 2004/64* (2013.01)

(56) References Cited

U.S. PATENT DOCUMENTS

| | | | |
|---|---|---|---|
| 2006/0116282 | A1 | 6/2006 | Honda et al. |
| 2006/0243947 | A1 | 11/2006 | Tsumura et al. |
| 2006/0275606 | A1 | 12/2006 | Mizutani |
| 2007/0259986 | A1* | 11/2007 | Elwakil .............. C09D 11/101 522/83 |
| 2008/0131614 | A1 | 6/2008 | Oriakhi |
| 2012/0302676 | A1 | 11/2012 | Oya et al. |

FOREIGN PATENT DOCUMENTS

| | | |
|---|---|---|
| CN | 103803643 A | 5/2014 |
| CN | 104671282 A | 6/2015 |
| CN | 104046117 B | 7/2016 |
| CN | 106882811 A | 6/2017 |
| EP | 3623041 A1 | 3/2018 |
| JP | H 05-138009 A | 6/1993 |
| JP | H 06-142491 A | 5/1994 |
| JP | H 06-330606 A | 11/1994 |
| JP | 2006-131458 A | 5/2006 |
| JP | 2006-307125 A | 11/2006 |
| JP | 2008-074645 A | 4/2008 |
| JP | 2009-298614 A | 12/2009 |
| JP | 2010-120786 A | 6/2010 |
| JP | 2013-023676 A | 2/2013 |
| JP | 2013-043788 A | 3/2013 |
| JP | 2013-075828 A | 4/2013 |
| JP | 2017-114721 A | 6/2017 |

OTHER PUBLICATIONS

Extended European Search Report issued in European Patent Application No. 18889418.2, dated Dec. 15, 2020.
Office Action issued in the U.S. Appl. No. 16/609,589, dated Dec. 21, 2020.
Office Action issued in the U.S. Appl. No. 16/609,589, dated Oct. 9, 2020.
Extended European Search Report issued in European Patent Application No. 18798808.4, dated Jan. 17, 2020.
Proceedings of the Meeting of the Society of Powder Technology, Japan, vol. 2011, 2011, pp. 25-26.
Peng et al., "General Synthesis and Optical Properties of Monodisperse Multifunctional Metal-Ion-Doped TiO2 Hollow Particles", J. Phys. Chem. C, 113, 20240-20245(2009).
Song, X. et al., "Fabrication of Hollow Hybrid Microspheres Coated with Silica/ Titania via Sol-Gel Process and Enhanced Photocatalytic Activities", J. Phys. Chem. C, May 16, 2007, vol. 111 ,pp. 8180-8187, ISSN 1932-7447, in particular, Introduction, Preparation of Hollow Si02/Ti02 Double-Shell Hybrid Microspheres and Doping Nitrogen Procedure., XRD Analysis., fig 4.

* cited by examiner

HOLLOW PARTICLES AND PRODUCTION METHOD THEREFOR, AND WHITE INK

This application is the U.S. National Phase under 35 U.S.C. § 371 of International Application PCT/JP2018/045279, filed Dec. 10, 2018, designating the U.S., and published in Japanese as WO 2019/117075 on Jun. 20, 2019, which claims priority to Japanese Patent Application No. 2017-236677, filed Dec. 11, 2017, the entire contents of which are incorporated herein by reference.

TECHNICAL FIELD

The present invention relates to hollow particles, a method of producing the same, and a white ink containing the hollow particles as a coloring agent.

BACKGROUND ART

The hollow particles are particulates having a hollow cavity therein. Conventionally, hollow particles have been widely used as a microcapsule in which various functional substances are contained in a hollow cavity. Since hollow particles have light scattering property due to a hollow cavity, they are useful as a light scattering agent or a light scattering aid which imparts performance, such as shininess, glossiness, opacity or whiteness, to coating agents for papers, fibers, leathers, glasses or metals, etc., inks, paints and cosmetics. Further, hollow particles are also expected to be used as a refractive index adjusting agent, a weight reducing agent, a sound insulating material, a heat insulating material and the like.

Among hollow particles, those comprising silica or metallic oxides such as titanium oxide and zirconium oxide, are industrially useful and expected to be applied as a weight reducing agents or white pigments because of their excellent structural stability and chemical stability. In particular, hollow particles containing titanium oxide are considered useful as a light scattering material or a catalyst material, due to their high refractive index and a catalytic activity. Methods for manufacturing hollow titanium oxide are disclosed in, for example, Patent Documents 1 and 2.

Patent Document 1: Japanese Unexamined Patent Application, Publication No. 2013-43788

Patent Document 2: Japanese Unexamined Patent Application, Publication No. 2010-120786

DISCLOSURE OF THE INVENTION

Problems to be Solved by the Invention

As described above, hollow particles that contain silica or a metallic oxide are expected to be applied as a white pigment or the like. However, according to confirmation by the present inventors, conventional hollow particles have room for improvement in sedimentation stability and particle strength.

In white inks prepared using hollow particles with poor sedimentation stability as a white pigment, a dispersion state is easily broken and the pigment easily settles. Therefore, before using a white ink, it is necessary to restore the dispersion state, so that settled pigment is again in a uniformly dispersed state by an operation such as stirring, and operability is poor.

Lower particle strength of a hollow particle causes the hollow particle to break and fail to maintain a hollow state, when preparing a dispersion. This makes it difficult to obtain good dispersion stability resulting from being a hollow particle. Also, if hollow particles break during preparation of a dispersion, particles of various sizes are generated in the dispersion and this makes it difficult to prepare a dispersion having a uniform primary particle diameter having a narrow particle size distribution. As a result, this makes it difficult to obtain a white ink having a good hiding property.

Conventional hollow particles and white inks that contain the hollow particles as a coloring agent have the above-mentioned problems.

Accordingly, it is an object of the present invention to provide a hollow particle excellent in sedimentation stability and particle strength, and enabling to obtain a white ink good in hiding property when contained as a coloring agent, a method of producing the same and a white ink containing the hollow particle as a coloring agent.

Means for Solving the Problems

As a result of intensive studies to solve the above-mentioned problems, the present inventors have completed the following inventions 1) to 14).

1) A first aspect of the present invention provides a hollow particle containing titanium oxide monocrystal and silica, in which a content of the titanium oxide is 86.0 mol % to 99.5 mol % and a content of the silica is 0.5 mol % to 14.0 mol %.

2) A second aspect of the present invention provides the hollow particle as described in the first aspect, in which a primary particle diameter of the hollow particle is 10 nm to 1,000 nm.

3) A third aspect of the present invention provides the hollow particle as described in the first or second aspect, in which a value of A/B is 0.3 to 0.95, provided that A and B represent an inner diameter and a primary particle diameter of the hollow particle, respectively.

4) A fourth aspect of the present invention provides the hollow particle as described in any one of the first to third aspects, in which a variation coefficient of the primary particle diameter is 10% or less.

5) A fifth aspect of the present invention provides a method of producing a hollow particle, comprising: forming a shell containing a titanium oxide precursor and a silica precursor on a surface of a template particle, which becomes a core, to obtain a core/shell particle; removing the template particle from the core/shell particle to obtain a shell particle; and firing the shell particle in an air atmosphere to obtain the hollow particle as described in any one of the first to fourth aspects.

6) A sixth aspect of the present invention provides a method of producing a hollow particle, comprising: forming a shell containing a titanium oxide precursor and a silica precursor on a surface of a template particle which becomes a core, to obtain a core/shell particle, and firing the core/shell particle in an air atmosphere to remove the template particle to obtain the hollow particle as described in any one of the first to fourth aspects.

7) A seventh aspect of the present invention provides the method of producing as described in the fifth or sixth aspect, in which the template particle is a polymer particle.

8) An eighth aspect of the present invention provides the method of producing as described in the fifth or sixth aspect, in which the template particle is a polymer particle containing styrene as a constituent monomer.

9) A ninth aspect of the present invention provides the method of producing as described in the fifth or sixth aspect, in which the template particle is a styrene-(meth)acrylic acid polymer particle.

10) A tenth aspect of the present invention provides the method of producing as described in the fifth or sixth aspect, in which the step of obtaining the core/shell particle is performed in the presence of a dispersant.

11) An eleventh aspect of the present invention provides a white ink containing the hollow particle as described in any one of the first to fourth aspects as a coloring agent.

12) A twelfth aspect of the present invention provides the white ink as described in the eleventh aspect, in which the white ink is an ink selected from the group consisting of aqueous inks, latex inks, solvent inks and ultraviolet curable inks.

13) A thirteenth aspect of the present invention provides use of the white ink as described in the eleventh or twelfth aspect in inkjet recording.

14) A fourteenth aspect of the present invention provides an inkjet recording method, in which recording is performed by ejecting droplets of the white ink according to the eleventh or twelfth aspect by using an ink jet printer, so that the droplets are attached to a recording medium.

Effects of the Invention

According to the present invention, it is possible to provide a hollow particle excellent in sedimentation stability and particle strength, and enabling to obtain a white ink good in hiding property when contained as a coloring agent, a method of producing the same and a white ink containing the hollow particle as a coloring agent.

PREFERRED MODE FOR CARRYING OUT THE INVENTION

<Hollow Particle>

The hollow particle as described in an embodiment of the present invention is a hollow particle containing titanium oxide monocrystal and silica, in which a content of the titanium oxide is 86.0 mol % to 99.5 mol % and a content of the silica is 0.5 mol % to 14.0 mol %.

The configuration of the hollow particle described in the present embodiment tends to result in excellent sedimentation stability and particle strength. In addition, the configuration of the hollow particle as described in the present embodiment tends to facilitate production of hollow particles having a uniform primary particle diameter and a small variation coefficient of primary particle diameters.

Known methods allow one to confirm that titanium oxide constituting the hollow particle according to the present embodiment is a monocrystal. The known methods include, for example, a method of measuring an electron diffraction image of a single particle using a transmission electron microscope (TEM). As used herein, a "monocrystal" means that the electron-diffraction image of a single particle is a spot image.

As the crystal form of titanium oxide, anatase, rutile, and brookite are known and can be appropriately selected depending on the application. Alternatively, a mixed crystal type in which these crystals are mixed can be used. In consideration of ease of production, rutile is preferable as the crystal type of titanium oxide. When a monocrystal of rutile titanium oxide is used, a proportion of the rutile titanium oxide in the titanium oxide is typically from 80% to 100%, preferably from 85% to 100%, more preferably from 90% to 100%.

The silica that constitutes the hollow particle according to the present embodiment may be crystalline or amorphous, but amorphous silica is preferable. Known methods allow one to confirm that the silica is amorphous. The known methods include, for example, measurement of diffraction peaks derived from a silica crystal (e.g., $\alpha\text{-SiO}_2$) using an X-ray diffractometer. As used herein, "amorphous" means that no distinct diffraction peaks originating from the crystal appear.

In the hollow particle according to the present embodiment, a content of titanium oxide is preferably 90.0 mol % to 99.5 mol %, and more preferably 95.0 mol % to 99.5 mol %. In the hollow particle according to the present embodiment, a content of silica is preferably 0.5 mol % to 10.0 mol %, and more preferably 0.5 mol % to 5.0 mol %.

The content of titanium oxide and that of silica contained in a hollow particle can be confirmed by known methods. The known methods include, for example, a calibration curve method using an analyzer such as a fluorescence X-ray analyzer along with a standard sample. In the present specification, the content of titanium oxide and that of silica contained in a hollow particle are calculated by assuming that the titanium oxide precursor and the silica precursor are converted into titanium oxide and silica, respectively, at a conversion rate of 100%, when the hollow particle is produced. When calculating these contents, the second decimal place is rounded off and figures up to the first decimal place are adopted.

It is difficult to determine the primary particle diameter of the hollow particles according to the present embodiment to a particular one, because the primary particle diameter has an appropriate range depending on the application. From a viewpoint of manufacturing, the primary particle diameter typically ranges from 10 nm to 1,000 nm, preferably from 50 nm to 750 nm, more preferably from 100 nm to 700 nm, even more preferably from 150 nm to 500 nm, and most preferably from 180 nm to 500 nm. Such ranges tend to allow stable production of hollow particles having desired structure. For a white pigment used as a base, the primary particle diameter typically ranges from 200 nm to 450 nm, and preferably from 250 nm to 350 nm, so that the hiding property is good.

Given that an inner diameter of a hollow particle is A and a primary particle diameter of the hollow particle is B, the value of A/B is typically from 0.3 to 0.95, preferably from 0.3 to 0.9, more preferably from 0.4 to 0.8, more preferably 0.5 to 0.8, and most preferably 0.6 to 0.8. Such ranges tend to allow easier production of hollow particles excellent in sedimentation stability and particle strength. Note that the inner diameter of a hollow particle refers to a diameter of a hollow cavity that the hollow particle has inside.

In this specification, the inner diameter A and primary particle diameter B of a hollow particle are an arithmetic mean value of inner diameters of 10 hollow particles and an arithmetic mean value of primary particle diameters of the 10 hollow particles, respectively, with the 10 hollow particles being randomly photographed by transmission electron microscopy (TEM). When a significant figure of A/B is one digit after the decimal point, the A/B is calculated by rounding off the second decimal place. When a significant figure of A/B is two digits after the decimal point, the A/B is calculated by rounding off the third decimal place.

A variation coefficient of primary particle diameters of hollow particles can be calculated from the following equation.

Variation coefficient (%)=(standard deviation of primary particle diameter (nm)/arithmetic mean particle diameter (nm))×100

A smaller variation coefficient is preferable because it indicates that particles having a uniform diameter are obtained. The variation coefficient is usually 10% or less, preferably 8% or less, more preferably 7% or less, and most preferably 5% or less. The lower limit is preferably small, and ideally 0%.

The hollow particle according to the present embodiment preferably does not have a pore leading from a surface of the particle to a pore inside. Presence or absence of such a pore can be confirmed, for example, by measuring an adsorption amount and a desorption amount with respect to relative pressure using a pore distribution measuring device (for example, BELSORP-mini II manufactured by Microtrac Bell). As used herein, "does not have a pore leading . . . to a pore inside" means that the adsorption/desorption isotherm produced from the adsorption and desorption amounts is not type IV or type V in IUPAC classification. In the IUPAC classification, types II and III are preferred, and type II is more preferred.

The particle shape of the hollow particle is not particularly limited, and examples of the particle shape include a spherical shape, a concavo-convex shape, an irregular shape, or the like. Among these, spherical particles are preferable, and true spherical particles are more preferable. It is preferable that a hollow cavity in a hollow particle has a higher circularity when the hollow cavity is regarded as a sphere.

The hollow particle according to the present embodiment may further contain an element other than titanium oxide and silica. Examples of such element include an element selected from Sn, Cd, Fe, Ni, Zn, Mn, Co, Cr, Cu, K, Na, Li, P, S and the like. These elements may be of one or two or more.

When the hollow particle according to the present embodiment further contains an element other than titanium oxide and silica, the total content of such an element is usually 0.1 mol % to 15 mol %, preferably 0.1 mol % to 10 mol %, more preferably 0.1 mol % to 5 mol %, based on the mol number of titanium in the titanium oxide. Such ranges tend to allow obtainment of less colored hollow particles (i.e., high whiteness).

The hollow particle according to the present embodiment may further have a layer of another material on its surface as required. Examples of the other material include alumina, aluminum hydroxide, zinc oxide, zinc hydroxide, zirconia, organic matter and the like.

The hollow particle according to the present embodiment is useful in various applications such as white pigments for white inks, or light scattering agents or light scattering aids, etc. in cosmetics and the like.

<Method for Manufacturing Hollow Particles>

The hollow particle according to the present embodiment can be manufactured according to a known method described in, for example, Xiong Wen (David) Lou, Lynden A. Archer and Zichao Yang, Adv. Mater., 2008, 20, pp. 3987-4019, and the like.

Among them, a preferred production method includes a step of forming a shell containing a titanium oxide precursor and a silica precursor on the surface of a template particle which becomes a core, to obtain a core/shell particle (hereinafter also referred to as a "first step"); a step of removing the template particle from the core/shell particle to obtain a shell particle (hereinafter also referred to as a "second step"); and a step of firing the shell particle in an air atmosphere to obtain the hollow particle (hereinafter also referred to as a "third step").

Unless otherwise specified, it is preferable to carry out the steps described below under agitation.

[First Step]

The first step includes, for example, a step of reacting the template particle with a titanium oxide precursor and a silica precursor in an organic solvent in the presence of a base. The silica precursor may be added after the titanium oxide is added or concurrently together with the titanium oxide precursor. The first step allows obtainment of a core/shell particle in which a shell containing a titanium oxide precursor and a silica precursor are formed on the surface of a template particle, which becomes a core.

As the template particle, a particle selected from polymer particles and inorganic particles can be mentioned. Examples of the template particles include polymer particles obtained by polymerizing at least one type of monomer selected from (meth)acrylate-based, a vinyl-based, a styrene-based and a urethane-based monomer; and inorganic particles such as calcium carbonate, iron oxide, cobalt oxide, manganese oxide, chromium oxide and nickel oxide. Among these, polymer particles are preferable, polymer particles containing styrene as a constituent monomer are more preferable, styrene-(meth)acrylic acid polymer particles are even more preferable, and styrene-methacrylic acid polymer particles are particularly preferable. In this specification, the term "(meth)acrylate" refers to both acrylates and methacrylates, and the term "(meth)acrylic acid" refers to both acrylic acid and methacrylic acid.

The titanium oxide precursor is not particularly limited, and any substance that can be converted to titanium oxide by a chemical or physical method can be used. Among the titanium oxide precursor, titanium alkoxide is preferred. As the titanium alkoxide, titanium tetraalkoxide is preferred, titanium tetra-C1-C6-alkoxide is more preferred, and titanium tetrabutoxide is most preferred.

By controlling an addition amount of the titanium oxide precursor, thickness of a shell can be controlled. The titanium oxide precursor may be added at one time in an amount required to make the shell have a particular thickness, or may be added in aliquots. Addition of the titanium oxide precursor in aliquots tends to make the shell more uniform in thickness.

The silica precursor is not particularly limited, and any substance that can be converted to silica by a chemical or physical method can be used. Among silica precursors, silane alkoxide is preferred. As the silane alkoxide, silane tetraalkoxide is preferable, silane tetra C1-C4 alkoxide is more preferable, and silane tetra ethoxide is most preferable.

Examples of organic solvents include hydrocarbon-based solvents (such as toluene, xylene, hexane, cyclohexane and n-heptane); alcohol-based solvents (such as methanol, ethanol, isopropyl alcohol, butanol, t-butanol and benzyl alcohol); ketone-based solvents (such as acetone, methyl ethyl ketone, methyl isobutyl ketone, diisobutyl ketone, cyclohexanone and acetylacetone); ester-based solvents (such as ethyl acetate, methyl acetate, butyl acetate, cellosolve acetate and amyl acetate); ether-based solvents (such as isopropyl ether, methyl cellosolve, butyl cellosolve, tetrahydrofuran and 1,4-dioxane); glycol-based solvents (such as ethylene glycol, diethylene glycol, triethylene glycol, propylene glycol and octylene glycol); glycol ether-based solvents (such as diethylene glycol monomethyl ether and propylene glycol monomethyl ether); glycol ester-based solvents (such as ethylene glycol monomethyl ether acetate, propylene glycol monomethyl ether acetate and diethylene glycol monoethyl ether acetate); glyme-based solvents (such as monoglyme and diglyme); halogen-based solvents (such as dichloromethane and chloroform); amide-based solvents (such as N,N-dimethylformamide, N,N-dimethylacetamide and N-methyl-2-pyrrolidone); pyridine, sulfolane, acetonitrile and dimethylsulfoxide; and the like.

As the organic solvent, one type may be used alone, or two or more types may be used in combination. For instance, using two or more types of organic solvents in combination and controlling the ratio, the concentration of template particles and the method of adding a base allow to carry out the first step while maintaining the dispersion state of the reaction solution in a good condition.

Examples of the base include inorganic bases and organic bases. Examples of the inorganic base include a hydroxide of an element belonging to Group 1 or Group 2 of the periodic table, preferably a hydroxide of Na, K, Ca, Mg, Al, Fe, etc.; ammonia; and the like. Examples of the organic base include heteroaromatic ring compounds such as pyridine; alkylamines (preferably trialkylamines, more preferably tri-C1-C4-alkylamines) such as triethylamine; hydroxyalkylamines (preferably tri(hydroxyalkyl)amines, more preferably tri(hydroxy-C1-C4-alkylamines)) such as triethanolamine; and the like.

The first step is preferably performed in an inert gas atmosphere such as nitrogen or argon. The reaction temperature in the first step is usually −30° C. to 80° C., preferably 0° C. to 50° C. Since the reaction time of the first step varies depending on the reaction temperature, the thickness of shell and the like, it is difficult to determine the reaction time to a particular one. The typical range therefor is about 0.1 hours to 10 hours, preferably about 0.5 hours to 7 hours.

When the template particle is a polymer particle and the sign of the surface potential thereof is the same as that of titanium oxide, the core/shell particles may be formed by the following method. That is, an organic polymer (e.g., polyethyleneimine) having a sign opposite to the sign of the above-mentioned surface potential is adsorbed onto the surface of the template particle. Then, the core/shell particle can be formed by making fine particles of titanium oxide deposit or adsorb on the surface of the organic polymer and adding a titanium oxide precursor as necessary. It is possible to make the crystal type of titanium oxide produced from a titanium oxide precursor, rutile by using, for instance, rutile titanium oxide as the fine particle of titanium oxide.

In the first step, reaction is performed in a state of dispersion. Therefore, the first step is preferably carried out in the presence of a dispersant in order to improve dispersion stability of the dispersion. The type of dispersant is not particularly limited as long as it does not interfere with the formation of shell. Examples of such dispersants include, for example, polyalkylene glycols such as polyethylene glycol and polypropylene glycol; polyvinyl pyrrolidone; Flowlen series manufactured by Kyoei Chemical Co., Ltd.; DISPERBYK series manufactured by Byk Chemie Japan Co., Ltd.; Solsperse series manufactured by Nippon Lubrizole Co., Ltd.; Ajisper series manufactured by Ajinomoto Fine Techno Co., Inc.; Disparlon series manufactured by Kusumoto Chemicals Ltd.; and the like.

[Second Step]

The second step includes, for example, a step of dissolving the template particles in a solvent to remove them. As such a solvent, a solvent which does not dissolve or destroy the shell particles is preferable. When the template particles are polymer particles, examples of the organic solvent to be used in the second step include methyl ethyl ketone, toluene, tetrahydrofuran and chloroform, etc. When the template particles are inorganic particles, examples of the solvent used in the second step include aqueous solutions of acids such as dilute hydrochloric acid, dilute nitric acid, or dilute sulfuric acid.

[Third Step]

The third step includes, for example, a step of obtaining hollow particles by firing the shell particles obtained in the second step. Although firing can be typically performed in an atmosphere of a gas selected from one or more of air, nitrogen, argon, hydrogen, ammonia and the like, it is preferred to fire the shell particle in an air atmosphere in order to obtain monocrystalline titanium oxide. In this specification, "air" is a gas constituting the lowest layer of the earth's atmosphere, and means a gas obtained in a normal environment in which mankind lives.

Since the firing temperature of the third step varies depending on the material and the like of the hollow particle, it is difficult to determine the firing temperature to a particular one. The typical range thereof is 600° C. to 1,500° C., preferably 650° C. to 1,400° C., more preferably 700° C. to 1,300° C., and even more preferably 750° C. to 1,200° C. Since the firing time of the third step varies depending on the firing temperature and the like, it is difficult to determine the firing time to a particular one. The typical range thereof is from 0.5 hours to several tens of hours, preferably from about 1 hour to 10 hours.

When the template particles are polymer particles, the second step is unnecessary. That is, by the third step of firing the core/shell particles obtained in the first step, removal of the template particles and firing of the shell particles can be performed simultaneously. Therefore, the hollow particles can be manufactured by only two steps of the first step and the third step.

The hollow particles obtained in the third step sometimes contain particles of by-products having non-uniform shape. The content of the by-product is typically 10% or less, and preferably 5% or less. Precise control of synthetic conditions and the like can suppress the formation of by-product particles. The content of by-products can be calculated by the number of particles having a non-uniform shape among 100 hollow particles randomly photographed by a transmission electron microscope (TEM) or a scanning electron microscope (SEM).

<White Inks>

The white ink according to the present embodiment contains the hollow particle according to the present embodiment described above as a coloring agent. The white ink according to the present embodiment can be used as an ink selected from the group consisting of aqueous inks, latex inks, solvent inks, and UV-curable inks. Such various inks can be prepared by appropriately adding components required for the respective inks together with the hollow particle as a coloring agent.

[Aqueous Inks]

When the white ink according to the present embodiment is formed into an aqueous ink, it is preferable that the white ink contains water, a dispersant, a water-soluble organic solvent and a surfactant. There is no limitation on the water which can be used, but it is preferable that the water contains few impurities such as inorganic ions. Such water includes ion exchanged water, distilled water and the like.

Examples of the dispersant include copolymers obtained by polymerizing at least two monomers selected from styrene and its derivatives; vinylnaphthalene and its derivatives; aliphatic alcohol esters of α,β-ethylenically unsaturated carboxylic acids; acrylic acid and its derivatives; maleic acid and its derivatives; itaconic acid and its derivatives; faric acid and its derivatives; vinyl acetate, vinyl alcohol, vinyl pyrrolidone, acrylamide and their derivatives; and the like. Preferably, at least one monomer is a hydrophilic monomer. Types of copolymers include, for example, block copolymers, random copolymers, graft copolymers, salts thereof and the like.

Dispersants may be synthesized or purchased as a commercially available product. Specific examples of the commercially available products include Joncryl 62, 67, 68, 678 and 687, etc. (styrene acrylic resin manufactured by BASF Corporation); Movinyl S-100A (modified vinyl acetate resin manufactured by Hoechst Synthesis Corporation); Jurimer AT-210 (polyacrylic acid ester copolymer manufactured by Nihon Junyaku Co., Ltd); DISPERBYK series (e.g., DISPERBYK-2010) manufactured by BYK Chemie Japan Co., Ltd.; and the like. When a dispersant is synthesized, a dispersant disclosed in WO 2013/115071 is preferably exemplified.

Examples of the water-soluble organic solvent include: C1-C6 alcohols such as methanol, ethanol, propanol, isopropanol, butanol, isobutanol, secondary butanol and tertiary butanol; carboxylic acid amides such as N,N-dimethylformamide and N,N-dimethylacetamide; lactams such as 2-pyrrolidone, N-methyl-2-pyrrolidone and N-methylpyrrolidin-2-one; cyclic ureas such as 1,3-dimethyl imidazolidin-2-one and 1,3-dimethylhexahydropyrimid-2-one; ketones or ketoalcohols such as acetone, 2-methyl-2-hydroxypentan-4-one and ethylene carbonate; cyclic ethers such as tetrahydrofuran and dioxane; a mono, oligo, or polyalkylene glycol or thioglycol having a C2-C6 diol or C2-C6-alkylene unit, such as ethylene glycol, diethylene glycol, 1,2-propanediol, 1,3-propanediol, 1,2-butanediol, 1,4-butanediol, 1,2-hexanediol, 1,6-hexanediol, diethylene glycol, triethylene glycol, tetraethylene glycol, dipropylene glycol, polyethylene glycol, polypropylene glycol, thiodiglycol and dithiodiglycol having a molecular weight of 400, 800, 1540 or more; polyols (triols) such as glycerin, diglycerin, hexane-1,2,6-triol and trimethylol propane; dimethylsulfoxide; glycol ethers or glycol ether acetates, such as propylene glycol monomethyl ether, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, dipropylene glycol monomethyl ether acetate, ethylene glycol monomethyl ether propionate, ethylene glycol monoethyl ether propionate, ethylene glycol monobutyl ether propionate, diethylene glycol monomethyl ether propionate, propylene glycol monomethyl ether propionate, dipropylene glycol monomethyl ether propionate, ethylene glycol monomethyl ether butyrate, ethylene glycol monoethyl ether butyrate, ethylene glycol monobutyl ether butyrate, diethylene glycol monomethyl ether butyrate, diethylene glycol monoethyl ether butyrate, diethylene glycol monobutyl ether butyrate, propylene glycol monomethyl ether butyrate and dipropylene glycol monomethyl ether butyrate; and the like.

Examples of the surfactant include known surfactants such as anionic, cationic, nonionic, amphoteric, silicone-based and fluorine-based surfactants. Among these, nonionic surfactants and silicone-based surfactants are preferable, and silicone-based surfactants are more preferable.

Examples of the anionic surfactant include alkylsulfocarboxylic acid salts, α-olefinsulfonic acid salts, polyoxyethylene alkyl ether acetic acid salts, polyoxyethylenealkyl ether sulfuric acid salts, N-acylamino acids or salts thereof, N-acylmethyltaurine salts, alkylsulfuric acid salt polyoxyalkylether sulfuric acid salts, alkylsulfuric acid salt polyoxyethylenealkyl ether phosphoric acid salts, rosin acid soap, castor oil sulfuric acid ester salts, lauryl alcohol sulfate ester salts, alkylphenolic phosphate esters, alkyl phosphates, alkylarylsulfonic acid salts, diethyl sulfosuccinic acid salts, diethylhexyl sulfosuccinic acid salts and dioctylsulfosuccinic acid salts, etc.

Examples of the cationic surfactant include 2-vinylpyridine derivatives and poly-4-vinylpyridine derivatives, etc.

Examples of the nonionic surfactant include: ether-based nonionic surfactants such as polyoxyethylene nonylphenyl ether, polyoxyethylene octylphenyl ether, polyoxyethylene dodecylphenyl ether, polyoxyethylene oleyl ether, polyoxyethylene lauryl ether and polyoxyethylene alkyl ether; ester-based nonionic surfactants such as polyoxyethylene oleate, polyoxyethylene distearate, sorbitan laurate, sorbitan monostearate, sorbitan monooleate, sorbitan sesquioleate, polyoxyethylene monooleate and polyoxyethylene stearate; acetylene glycol (alcohol)-based nonionic surfactants such as 2,4,7,9-tetramethyl-5-decyne-4,7-diol, 3,6-dimethyl-4-octyne-3,6-diol and 3,5-dimethyl-1-hexyn-3-ol, and C2-C4-alkyleneoxy adducts thereof; polyglycol ether-based nonionic surfactants; and the like.

Examples of the amphoteric surfactant include lauryl dimethylamino acetate betaine, 2-alkyl-N-carboxymethyl-N-hydroxyethylimidazolinium betaine, coconut oil fatty acid amide propyldimethylamino acetate betaine, polyoctyl polyaminoethylglycine and imidazoline derivatives, etc.

Examples of the silicone-based surfactant include polyether-modified siloxane and polyether-modified polydimethylsiloxane, etc. Examples thereof include Dynol 960 and Dynol 980, manufactured by Air Products; Silface SAG001, Silface SAG002, Silface SAG003, Silface SAG005, Silface SAG503A, Silface SAG008, Silface SAG009 and Silface SAG010, manufactured by Nisshin Chemical Co., Ltd.; BYK-345, BYK-347, BYK-348, BYK-349 and BYK-3455, manufactured by BYK Chemie Corporation; and the like. Among these, polyether-modified siloxanes known from the BYK series, etc. manufactured by BYK Chemie Corporation are preferable.

Examples of the fluorosurfactant include perfluoroalkyl sulfonic acid compounds, perfluoroalkyl carboxylic acid-based compounds, perfluoroalkyl phosphate compounds, perfluoroalkyl ethylene oxide adducts and polyoxyalkylene ether polymer compounds having a perfluoroalkyl ether group on its side chain, etc. The fluorosurfactant can be readily purchased from DuPont, Omnova, DIC, BYK Chemie, etc. in a variety of different types of products.

[Latex Inks]

When the white ink according to the present embodiment is formed into a latex ink, it is preferable that the white ink contains water, a water-soluble organic solvent and a resin. The resin in the white ink may also be in the state of an emulsion or suspension. Examples of water and the water-soluble organic solvent include those that are the same as those contained in the aqueous ink.

Examples of the resin include water-soluble vinyl-based resins, acrylic resins, alkyd-based resins, polyester-based resins, phenoxy-based resins, polyolefin-based resins and modified resins thereof. Among these, acrylic resins, water-soluble polyurethane-based resins, water-soluble polyester-based resins, water-soluble acrylic resins, etc. are preferable.

[Solvent Inks]

When the white ink according to the present embodiment is formed into a solvent ink, it is preferable that the white ink contains a dispersant and a non-aqueous organic solvent.

Examples of the dispersant include a Solbin series manufactured by Nissin Chemical Industry Co., Ltd.; Flowlen series manufactured by Kyoei Chemical Co., Ltd.; and an ANTI-TERRA series and a DISPERBYK series manufactured by Byk Chemie Japan Co., Ltd., etc.

Examples of the nonaqueous organic solvent include hydrocarbon-based solvents, ester-based solvents and ketone-based solvents, etc. Examples of the hydrocarbon-based solvent include n-hexane, n-heptane, n-octane, isooctane, cyclohexane, methylcyclohexane, benzene, toluene, o-xylene, m-xylene, p-xylene and ethylbenzene, etc. Examples of the ester-based solvent include propyl formate, n-butyl formate, isobutyl formate, amyl formate, ethyl acetate, n-propyl acetate, isopropyl acetate, n-butyl acetate, isobutyl acetate, sec-butyl acetate, n-amyl acetate, isoamyl acetate, methylisoamyl acetate, sec-hexyl acetate, methyl propionate, ethyl propionate, n-butyl propionate, butyl butyrate, ethyl butyrate, methyl lactate and γ-butyrolactone, etc. Examples of the ketone-based solvent include: methyl ethyl ketone, methyl n-propyl ketone, methyl n-butyl ketone, methyl isobutyl ketone, diethyl ketone, ethyl n-butyl ketone, di-n-propyl ketone and mesityl ketone, etc.

[Ultraviolet Curable Inks]

When the white ink according to the present embodiment is formed into an ultraviolet curable ink, it is preferable that the white ink contains a curable monomer or a curable oligomer and a photo-curing initiator. The white ink may further contain a photo-curing sensitizer.

As used herein, a "curable monomer" refers to a monomer that polymerizes by applying an external stimulus to form a cured product. A "curable oligomer" refers to an oligomer that polymerizes by applying an external stimulus to form a cured resin. Examples of the curable monomer include a low viscosity acrylic monomer of a radical polymerization type; vinyl ethers, an oxetane-based monomer and a cyclic aliphatic epoxy monomer, all of which are cationic polymerization type; and the like. The curable oligomer includes an acrylic oligomer of cationic polymerization type.

Examples of the low-viscosity acrylic monomer include methoxypolyethylene glycol acrylate, phenoxyethylene glycol acrylate, phenoxydiethylene glycol acrylate, phenoxyhexaethylene glycol acrylate, methoxypolyethylene glycol methacrylate, 3-chloro 2-hydroxypropyl methacrylate, β-carboxyethyl acrylate, acryloyl morpholine, diacetone acrylamide, vinylformamide, N-vinylpyrrolidone, neopentyl glycol dimethacrylate 2PO neopentylglycol dimethacrylate, polyethylene glycol diacrylate, ethylene glycol dimethacrylate, polypropylene glycol diacrylate, tetraethylene glycol diacrylate, glycerol dimethacrylate, glycerol acrylate methacrylate, modified epoxidized polyethylene glycol diacrylate, 2-(2-vinyloxyethoxy)ethyl acrylate, ethoxylated trimethylolpropane triacrylate, ethoxylated glycerine triacrylate and EO-modified trimethylolpropane triacrylates, etc.

Examples of the vinyl ether include hydroxybutyl vinyl ether, triethylene glycol divinyl ether, cyclohexanedimethanol divinyl ether, propenyl ether of propylene carbonate, dodecyl vinyl ether, cyclohexanedimethanol monovinyl ether, cyclohexane vinyl ether, diethylene glycol divinyl ether, 2-ethylhexyl vinyl ether, dipropyleneglycol divinyl ether, tripropylene glycol divinyl ether, hexanediol divinyl ether, octadecyl vinyl ether, butanediol divinyl ether, isopropylvinyl vinyl ether, allyl vinyl ether, 1,4-butanediol divinyl ether, nonanediol divinyl ether, cyclohexanediol vinyl ether, cyclohexane dimethanol vinyl ether, triethylene glycol divinyl ether, trimethylolpropane trivinyl ether, pentaerythritol tetravinyl ether, VEEA acrylic acid-2-(2-vinyloxyethoxy) ethyl or VEEM methacrylic acid-2-(2-vinyloxyethoxy) ethyl, etc.

Examples of the oxetane monomer include 3-ethyl-3-hydroxymethyloxetane, 1,4-bis[((3-ethyloxetan-3-yl)methoxy)methyl]benzene, 3-ethyl-3-[(3-ethyloxetan-3-yl)methoxy)methyl]oxetane, 3-ethyl-3-(phenoxymethyl) oxetane, etc.

Examples of the cyclic aliphatic epoxy monomer include Celloxide 2000 and Celloxide 3000 (manufactured by Daicel Corporation); CYRACURE UVR-6015, CYRACURE UVR-6028, CYRACURE UVR-6105, CYRACURE UVR-6128, CYRACURE ERL-4140 and derivatives thereof (manufactured by Dow Chemical Company); DCPD-EP and its derivatives (manufactured by Maruzen Petrochemical Co., Ltd.); and the like.

Examples of the acrylic oligomer include hyperbranched polyester acrylate, polyester acrylate, urethane acrylate and epoxy acrylate, etc.

Examples of the photopolymerization initiator is not particularly limited, and known photopolymerization initiators can be used depending on the purpose. Examples thereof include 2,4,6-trimethylbenzoyl diphenylphosphine oxide, 2,4,6-trimethylbenzoyl phenylethoxyphosphine oxide, bis(2,4,6-trimethylbenzoyl)-phenylphosphine oxide, bis(2,6-dimethoxybenzoyl)-2,4,4-trimethyl-pentylphosphine oxide, 1-hydroxycyclohexyl phenyl ketone (Irgacure 184; manufactured by BASF), 2-hydroxy-2-methyl-[4-(1-methylvinyl)phenyl]propanol oligomer (Esacure ONE; manufactured by Lamberti), 1-[4-(2-hydroxyethoxy)-phenyl]-2-hydroxy-2-methyl-1-propan-1-one (Irgacure 2959; manufactured by BASF), 2-hydroxy-1-{4-[4-(2-hydroxy-2-methyl-propionyl)-benzyl]-phenyl}-2-methyl-propan-1-one (Irgacure 127; manufactured by BASF), 2,2-dimethoxy-2-phenylacetophenone (Irgacure 651; manufactured by BASF), 2-hydroxy-2-methyl-1-phenyl-propan-1-one (Dalocure 1173; manufactured by BASF), 2-methyl-1-[4-(methylthio)phenyl]-2-morpholinopropan-1-one (Irgacure 907; manufactured by BASF), 2-benzyl-2-dimethylamino-1-(4- morpholinophenyl)-butan-1-one, 2-chlorothioxanthone, 2,4-dimethylthioxanthone, 2,4-diisopropylthioxantone and isopropylthioxantone, etc.

Among these, 2,4,6-trimethylbenzoyl diphenylphosphine oxide and 1-[4-(2-hydroxyethoxy)-phenyl]-2-hydroxy-2-methyl-1-propan-1-one are preferable from the viewpoints of curability and transparency.

The photopolymerization initiator may be an intramolecular hydrogen abstraction type photopolymerization initiator. Examples of the intramolecular hydrogen abstraction type photopolymerization initiator include oxyphenyl-based photopolymerization initiators such as methyl oxyphenylacetate (Irgacure MBF; manufactured by BASF), a blend of oxyphenylacetic acid 2-[2-oxo-2-phenylacetoxy-ethoxy]-ethyl ester and oxyphenylacetic acid 2-[2-hydroxy-ethoxy]-ethyl ester (Irgacure 754; manufactured by BASF), and the like.

It is also possible to use a photopolymerization initiation assistant such as an amine in combination with the photopolymerization initiator. Examples of the amine include 2-dimethylaminoethyl benzoate, dimethylaminoacetophenone, ethyl p-dimethylaminobenzoate and isoamyl p-dimethylaminobenzoate, etc.

[Preparation Methods, Etc.]

The white ink according to the present embodiment can be prepared by adding the hollow particles to a target liquid medium such as water or a non-aqueous solvent and dispersing the hollow particles in a known manner. Examples of the dispersing method include a method in which a coloring agent and a dispersant are put in a high-speed agitation homogenizer, a sand mill (bead mill), a roll mill, a ball mill, a paint shaker, an ultrasonic disperser, a microfluidizer, or the like, and dispersing is performed. As an example, when a sand mill is used, beads having a particle diameter of about 0.01 mm to 1 mm can be used, the filling rate of the beads can be appropriately set, and dispersing treatment can be performed.

The dispersion thus obtained may be subjected to operations such as filtration and centrifugation. This operation allows to equalize the size of the particle diameter of the particles contained in the dispersion.

Of all the above-mentioned components, one may be used alone or two or more may be used in combination. In addition, with regard to all the above-mentioned items, etc., a combination between preferable ones is more preferable and a combination between more preferable ones is even more preferable. The same applies to a combination of a preferable one and a more preferable one, as well as a combination of a more preferable one and an even more preferable one, or the like.

<Inkjet Recording Method>

The inkjet recording method according to the present embodiment performs recording by ejecting droplets of the white ink according to the present embodiment described above by using an inkjet printer, so that the droplets are attached to a recording medium. Examples of the method of ink jet printer include a piezo method and a thermal ink jet method, etc. The white ink according to the present embodiment can be used as an ink jet ink based on any method.

Examples of the recording medium include papers, films, fibers, cloths, leathers, ceramics, glasses and metals, etc.

In particular, the white ink according to the present embodiment is useful for recording on a recording material with a low lightness because printing letters on a surface to be printed with a low lightness such as black, etc. results in a recorded material with excellent visibility. In addition, the hiding property can be improved by making the white ink according to the present embodiment attach to a transparent recording medium to form a white base.

EXAMPLES

In the following, the present invention is explained in more detail with reference to the Examples, but the invention is not limited only to the Examples. In the Examples, when the intended amount of a substance was not obtained in one synthesis operation, etc., the synthesis operation, etc. was repeated until the intended amount of the substance was obtained. The primary particle diameter and the inner diameter of the hollow particles were measured using a transmission electron microscope (JEM-2800, manufactured by Nippon Electronics Co., Ltd.). The ratio of rutile titanium oxide in titanium oxide contained in the particles obtained in the Examples was calculated according to the following equation (1) using a powder X-ray diffractometer (X'Pert PRO manufactured by Spectris Co., Ltd.).

Abbreviations and the like in the following formula (1) have the following meanings. $F_R$: content of rutile titanium oxide (%). IA (101): intensity of (101) plane of anatase crystal measured by powder X-ray diffractometer. $I_R$ (110): intensity of (110) plane of rutile crystal measured by powder X-ray diffractometer.

$$F_R = \frac{1}{1 + 0.79\frac{I_A(101)}{I_R(110)}} \quad (1)$$

For measurement of sedimentation rate of hollow particles, a dispersion prepared in the following manner was used as a test substance. That is, hollow particles were added to distilled water so as to be 1% by mass to obtain a solution. This solution was treated with a filmix (RM manufactured by Primix Corporation) at 10,000 rpm for 10 minutes, and the obtained dispersion was used as a test substance. Then, the sedimentation rate of the hollow particles was measured using a centrifugal sedimentation type dispersion stability analyzer (LUMiFuge 110, manufactured by Nippon Luft Co., Ltd.) under the following conditions.

—Measurement Conditions—

Rotation number: 2,000 rpm.

Measurement temperature: 25° C.

Measurement time: 50 minutes.

Synthesis Example 1

Preparation of Ethanol Dispersion of Template Particles (Dispersion 1)

To 600 g of distilled water, 21 g of styrene, 2.4 g of methacrylic acid and 0.05 g of potassium persulfate were added, and emulsion polymerization was carried out at 80° C. to obtain an aqueous dispersion containing styrene-methacrylic acid polymer particles. The primary particle diameter of the obtained template particles was 237 nm. Dispersion 1 was prepared by adding ethanol to the aqueous dispersion of the template particles while concentrating the aqueous dispersion in an evaporator, so that water is replaced with ethanol. The content of the template particles in dispersion 1 was 9% by mass.

Example 1

(Step 1: Obtaining Core/Shell Particles)

20 g of ethanol, 8 g of acetonitrile, 0.1 g of polyvinylpyrrolidone and 5 g of dispersion 1 were cooled to 10° C. to obtain a liquid. To this liquid, 3 g of titanium tetrabutoxide, 0.1 g of tetraethyl orthosilicate and 3 g of a 1% aqueous potassium hydroxide solution were added every 0.5 hours in three aliquots, and the resulting mixture was left to react at 10° C. for 4 hours to obtain a liquid containing the core/shell particles. The obtained liquid was centrifuged at 15,000 rpm for 25 minutes to remove supernatant liquid, and the residue was dried in a vacuum dryer heated to 60° C. to obtain 2.0 g of intended core/shell particles.

(Step 2: Firing the Core Shell Particles to Remove Template Particles and obtain Hollow Particles)

2.0 g of the core/shell particles obtained in step 1 were placed on a ceramic board, set in a firing oven, and fired at 1,000° C. for 1 hour in an air atmosphere to obtain 0.7 g of hollow particles of Example 1.

Example 2

The same procedures were carried out as in Example 1, except that the amount of tetraethyl orthosilicate used in step 1 of Example 1 was changed from 0.1 g to 0.02 g and the 1% aqueous potassium hydroxide solution was changed to a 1% aqueous ammonia solution, to obtain 0.7 g of hollow particles of Example 2.

Example 3

The same procedures were carried out as in Example 1, except that the amount of tetraethyl orthosilicate used in step 1 of Example 1 was changed from 0.1 g to 0.01 g, to obtain 0.7 g of hollow particles of Example 3.

Example 4

The same procedures were carried out as in Example 1, except that the amount of tetraethyl orthosilicate used in step 1 of Example 1 was changed from 0.1 g to 0.04 g, to obtain 0.7 g of hollow particles of Example 4.

Example 5

The same procedures were carried out as in Example 1, except that the amount of titanium tetrabutoxide used in step 1 of Example 1 was changed from 3 g to 5 g and an amount of tetraethyl orthosilicate used in step 1 of Example 1 was changed from 0.1 g to 0.04 g, to obtain 1.2 g of hollow particles of Example 5.

Comparative Example 1

Although procedures of Example 1 were performed, except that the amount of tetraethyl orthosilicate used in step 1 of Example 1 was changed from 0.1 g to 0.002 g, to produce hollow particles, it was not possible to produce hollow particles, and particles having no hollow structures were obtained.

Comparative Example 2

2.0 g of the core/shell particles prepared in the same manner as in step 1 of Example 1 was placed on a ceramic board, set in a firing oven, fired at 800° C. for 1 hour in a hydrogen atmosphere, and then fired at 800° C. for 1 hour in an air atmosphere, whereby 0.7 g of hollow particles of Comparative Example 2 was obtained.

Comparative Example 3

2.0 g of the core/shell particles prepared in the same manner as in step 1 of Example 5 was placed on a ceramic board, set in a firing oven, and fired at 500° C. for 1 hour in an air atmosphere, whereby 1.2 g of hollow particles of Comparative Example 3 was obtained.

Figure 1:
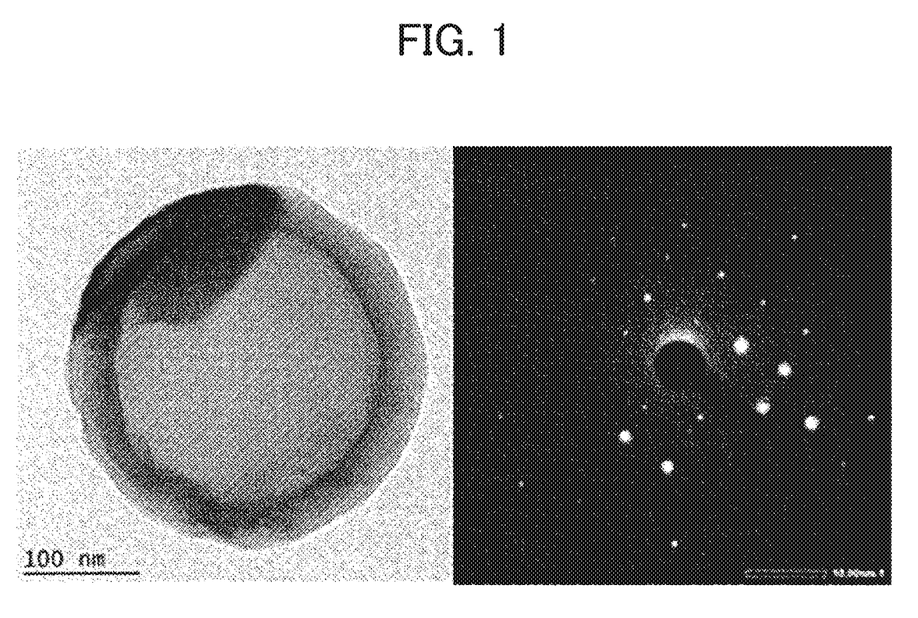
FIG. 1 is a transmission electron microscope (TEM) image of a hollow particle obtained in Example 1, and is a diagram showing an electron diffraction image of a single particle.
Figure 2:
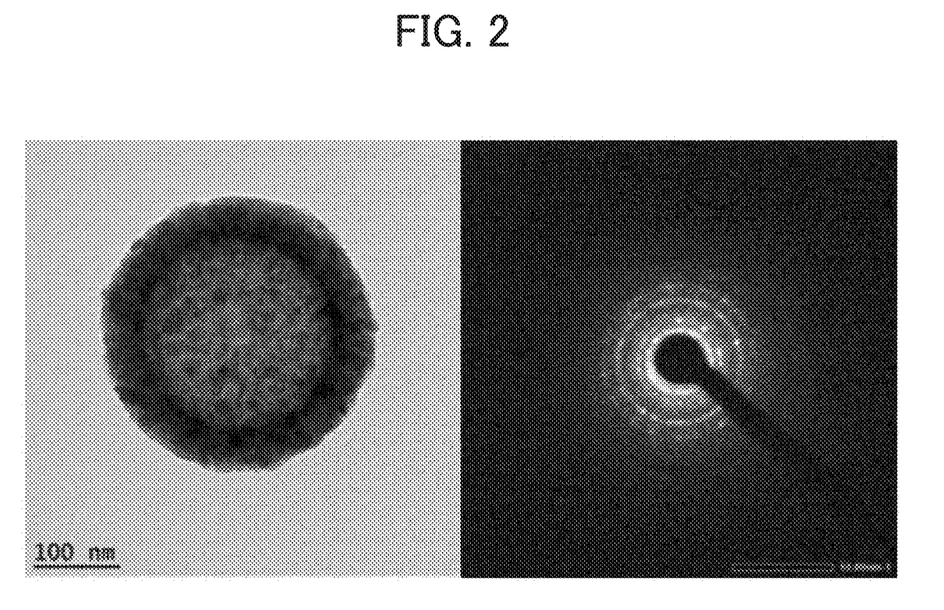
FIG. 2 is a transmission electron microscope (TEM) image of a hollow particle obtained in Comparative Example 2, and is a diagram showing an electron diffraction image of a single particle.

The physical properties of the particles obtained in Examples 1 to 5 and Comparative Examples 1 to 3 are shown in Table 1 below. Transmission electron microscopy (TEM) images of the hollow particles obtained in Example 1 and Comparative Example 2 and electron diffraction images of single particles thereof are shown in FIGS. 1 and 2, respectively. Silica contained in the particles obtained in Examples 1 to 5 and Comparative Examples 1 to 3 was amorphous silica, and diffraction peaks derived from crystalline silica did not appear in X-ray diffraction measurements.

TABLE 1

| Evaluation result | Example | | | | | Comparative Example | | |
|---|---|---|---|---|---|---|---|---|
| | 1 | 2 | 3 | 4 | 5 | 1 | 2 | 3 |
| Si | 4.7 | 0.9 | 0.5 | 1.9 | 1.1 | 0.1 | 4.7 | 1.1 |
| Hollow particle | Yes | Yes | Yes | Yes | Yes | No | Yes | Yes |
| Particle diameter | 300 | 295 | 293 | 300 | 344 | — | 300 | 348 |
| Variation coefficient | 2 | 2 | 2 | 1.3 | 3 | — | 2 | 2 |
| Hollow cavity diameter | 217 | 223 | 221 | 226 | 233 | — | 217 | 236 |
| A/B | 0.72 | 0.75 | 0.75 | 0.75 | 0.68 | — | 0.72 | 0.68 |
| $F_R$ | 93 | 100 | 100 | 98 | 100 | 95 | 85 | 0 |
| Monocrystal | Yes | Yes | Yes | Yes | Yes | — | No | No |
| Sedimentation rate | 33 | 30 | 28 | 35 | 65 | — | 43 | 74 |

Each item in Table 1 has the following meaning:

Si: a content of silica contained in particles (SiO₂ conversion value, units are [mol %]);

Note that a content of titanium oxide can be calculated by "100 mol %-content of silica (mol %)";

Hollow particle: "Yes" means that the obtained particles are hollow particles and "No" means that the obtained particles are not hollow particles;

Particle diameter: primary particle diameter B of a hollow particle (units are [nm]);

Variation coefficient: variation coefficient of primary particle diameters B of hollow particles (units are [%]); Hollow diameter: inner diameter A of a hollow particle (units are [nm]);

A/B: ratio of inner diameter A to primary particle diameter B of a hollow particle;

$F_R$: ratio of rutile titanium oxide in titanium oxide contained in particles (units are [%]);

Monocrystal: "Yes" means that a spot image was obtained as an electron diffraction image of a single particle which is a hollow particle, and "No" means that a spot image was not obtained;

Sedimentation rate: sedimentation rate of hollow particles (units are [μm/s]).

As shown in Table 1, it was confirmed that the sedimentation rate tended to increase as the particle diameter of hollow particles became larger. In addition, it was confirmed that hollow particles of the Examples had a lower sedimentation rate than the hollow particles of the Comparative Examples which had the same level of primary particle diameter and hollow diameter, and that sedimentation stability was good.

Synthesis Example 2

Preparation of Ethanol Dispersion of Template Particles (Dispersion 2)

To 600 g of distilled water, 126 g of styrene, 2.8 g of methacrylic acid and 0.12 g of potassium persulfate were added, and emulsion polymerization was carried out at 80° C. to obtain an aqueous dispersion containing styrene-methacrylic acid polymer particles. The primary particle diameter of the obtained template particles was 436 nm. Dispersion 2 was prepared by adding ethanol to the aqueous dispersion of the template particles while concentrating the aqueous dispersion in an evaporator, so that water is replaced with ethanol. The content of the template particles in dispersion 2 was 9% by mass.

Example 6

(Step 1: Obtaining Core/Shell Particles)
20 g of ethanol, 8 g of acetonitrile, 0.1 g of polyvinylpyrrolidone and 5 g of dispersion 2 were cooled to 10° C. to obtain a liquid. To this liquid, 20 g of titanium tetrabutoxide, 0.2 g of tetraethyl orthosilicate and 3 g of a 1% potassium hydroxide solution were added every 0.5 hours in eight aliquots, and the resulting mixture was reacted at 10° C. for 4 hours to obtain a liquid containing the core/shell particles. The obtained liquid was centrifuged under conditions of 15,000 rpm and 25 minutes to remove supernatant liquid, and the residue was dried in a vacuum dryer heated to 60° C. to obtain 3.1 g of intended core/shell particles.
(Step 2: Firing the Core/Shell Particles to Remove Template Particles and obtain Hollow Particles) 3.1 g of the core/shell particles obtained in step 1 was placed on a ceramic board, set in a firing oven, and fired at 1,000° C. for 1 hour in an air atmosphere to obtain 1.9 g of hollow particles of Example 6.

Example 7

The same procedures were carried out as in Example 1, except that the amount of tetraethyl orthosilicate used in step 1 in Example 1 was changed from 0.1 g to 0.2 g, to obtain 0.7 g of hollow particles of Example 7.

Example 8

Figure 3:
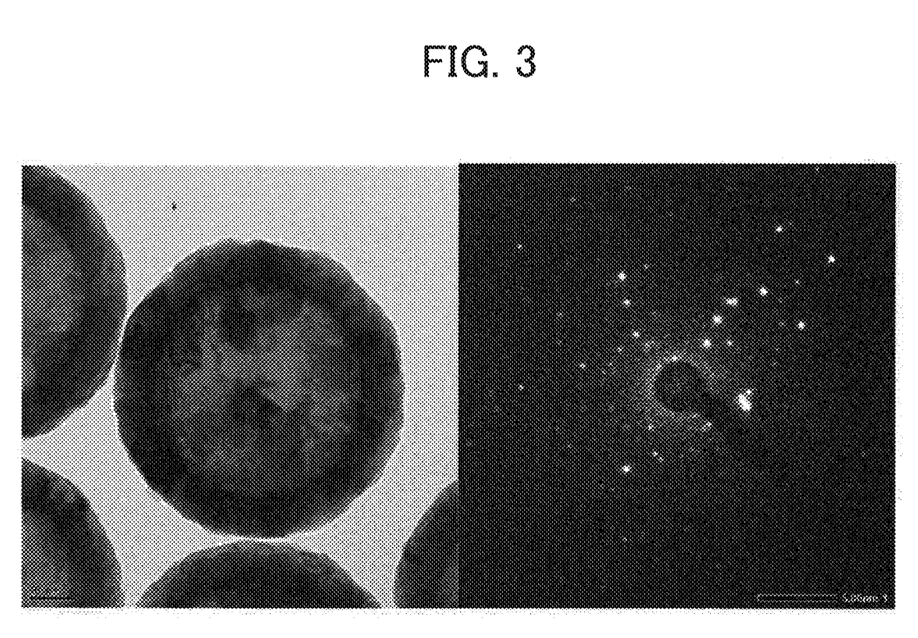
FIG. 3 is a transmission electron microscope (TEM) image of hollow particles obtained in Example 7, and is a diagram showing an electron diffraction image of a single particle.
Figure 4:
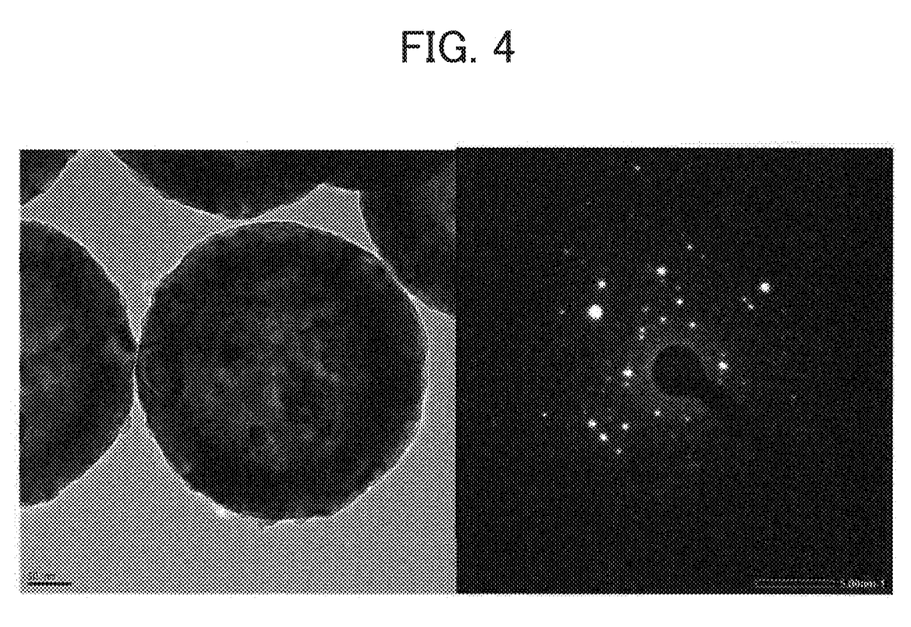
FIG. 4 is a transmission electron microscope (TEM) image of hollow particles obtained in Example 8, and is a diagram showing an electron diffraction image of a single particle.

The same procedures were carried out as in Example 1, except that the amount of tetraethyl orthosilicate used in step 1 in Example 1 was changed from 0.1 g to 0.3 g, to obtain 0.7 g of hollow particles of Example 8.
Physical properties of hollow particles obtained in Examples 6 to 8 are shown in Table 2 below. Further, transmission electron microscopy (TEM) images of the hollow particles obtained in Examples 7 and 8 and electron diffraction images of single particles thereof are shown in FIGS. 3 and 4, respectively. Silica contained in the hollow particles obtained in Examples 6 to 8 was amorphous silica, and diffraction peaks derived from crystalline silica did not appear in X-ray diffraction measurements.

TABLE 2

| Evaluation result | Example | | |
|---|---|---|---|
| | 6 | 7 | 8 |
| Si | 3.0 | 10.0 | 14.0 |
| Hollow particle | Yes | Yes | Yes |
| Particle diameter | 517 | 330 | 332 |
| Variation coefficient | 1 | 0.6 | 0.7 |
| Hollow cavity diameter | 390 | 231 | 228 |
| A/B | 0.75 | 0.70 | 0.69 |
| $F_R$ | 100 | 93 | 77 |
| Monocrystal | Yes | Yes | Yes |
| Sedimentation rate | 105 | 55 | 58 |

[Strength Test of Hollow Particles]
0.007 g of hollow particles obtained in Examples 1 and 5 and Comparative Examples 2 and 3 was added to 10 mL of distilled water, and subjected to ultrasonic wave treatment in an ultrasonic bath (W-113MkII manufactured by Honda Electronics Co., Ltd.) for 10 minutes to obtain a liquid prior to the strength test. The obtained liquid and 6 g of zirconia beads with a diameter of 0.03 mm were added to a filmix (RM manufactured by Primix Corporation), and the filmix was operated under conditions of 3,000 rpm and 10 minutes to obtain a liquid post the strength test.
Distilled water was added to the respective liquids obtained prior to and post the strength test, so that the respective liquids were diluted by 10-fold, and turbidity of the diluted liquid was measured. Turbidity was measured using a simultaneous color and turbidity measuring instrument (COH400 manufactured by Nippon Denshoku Industries Co., Ltd.). Turbidity is expressed as a TURB value and the TURB value is concentration with regard to kaolin-standard solutions. Rate of change in TURB value was calculated according to the equation below and the first decimal place was rounded. A larger rate of change in TURB value indicates higher strength of the hollow particles. Rates of change in TURB values are shown in Table 3 below.

Rate of change in TURB value (%)=(TURB value post strength test (mg/L)/TURB value prior to strength test (mg/L)×100

TABLE 3

| Test result | Rate of change in TURB value (%) |
|---|---|
| Example 1 | 79 |
| Example 5 | 70 |
| Comparative Example 2 | 18 |
| Comparative Example 3 | 14 |

As shown in Table 3, the hollow particles of Examples 1 and 5 were confirmed to have a higher rate of change in TURB value and higher particle strength than the hollow particles of Comparative Examples 2 and 3. Upon measuring hollow particles before and after the strength test using an electron microscope, a large number of hollow particles were confirmed even after the strength tests in Examples 1 and 5, but the number of hollow particles clearly decreased in Comparative Examples 2 and 3.

[Confirmation Test for Presence/Absence of Pores]

Figure 5:
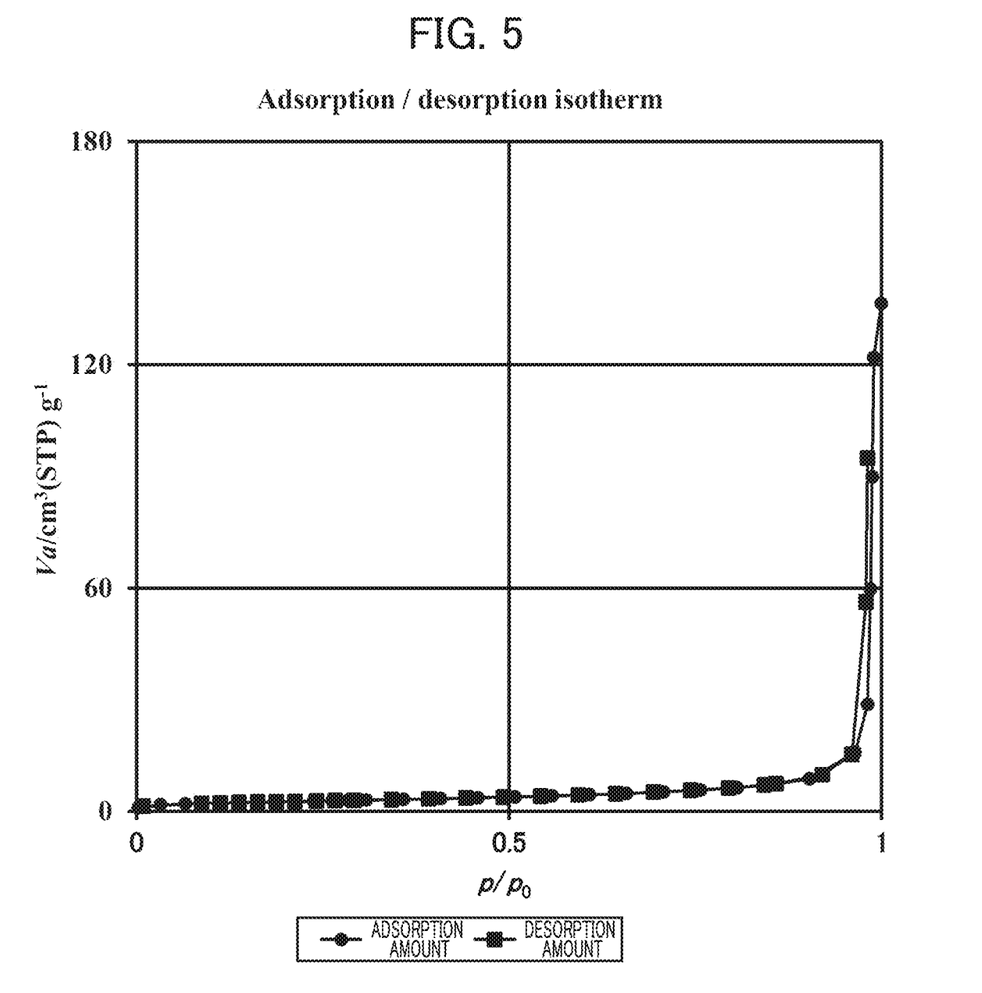
FIG. 5 is a diagram showing an adsorption-desorption isotherm of hollow particles obtained in Example 1.
Figure 6:
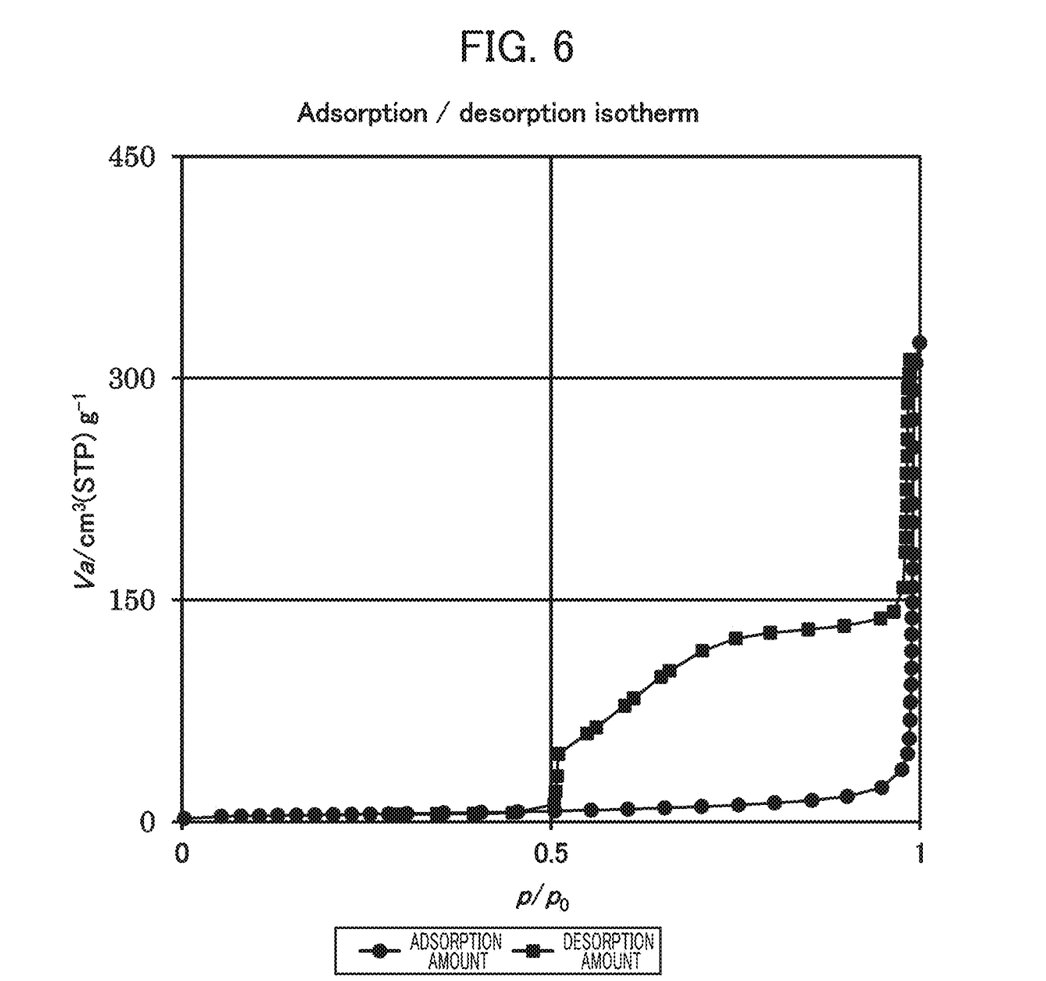
FIG. 6 is a diagram showing an adsorption-desorption isotherm of hollow particles obtained in Comparative Example 2.

In order to confirm whether or not pores leading to the inner pores were present on the surfaces of hollow particles, adsorption amounts and desorption amounts with respect to the relative pressures were measured for hollow particles obtained in Examples 1 and 5 and Comparative Examples 2 and 3, using a pore distribution measuring device (BELSORP-mini II, manufactured by Microtrack Bell Co., Ltd.), and an adsorption/desorption isotherm was created. IUPAC classification (type) of adsorption/desorption isotherms are shown in Table 4 below. Adsorption/desorption isotherms of hollow particles obtained in Example 1 and Comparative Example 2 are shown in FIGS. 5 and 6, respectively.

TABLE 4

| Test result | Example 1 | Example 5 | Comparative Example 2 | Comparative Example 3 |
|---|---|---|---|---|
| Adsorption-desorption isotherm | II | II | IV | IV |

As shown in Table 4, the adsorption/desorption isotherms of the hollow particles of Examples 1 and 5 were type II of IUPAC classification, and this confirmed that on the surfaces of the particles, there were no pores leading to pores inside. On the other hand, the adsorption/desorption isotherms of the hollow particles of Comparative Examples 2 and 3 were type IV of IUPAC classification, and on the surfaces of the particles, there were pores leading to pores inside.

Example 9

0.07 g of the hollow particles obtained in Example 1 and 0.175 g of a dispersant (DISPERBYK-2010, manufactured by BYK Chemie Japan, Inc.) were added to 7 ml of distilled water, and the mixture was added to a filmix (RM manufactured by Primix Corporation) and treated under conditions of 10,000 rpm and 10 minutes to obtain a dispersion. 5 g of the obtained dispersion, 0.1 g of 1,2-hexanediol, 0.75 g of resin (S-LEC KW-1, manufactured by Sekisui Chemical Co., Ltd.) and 1.5 g of distilled water were mixed to prepare a white ink of Example 9.

Comparative Example 4

Figure 7:
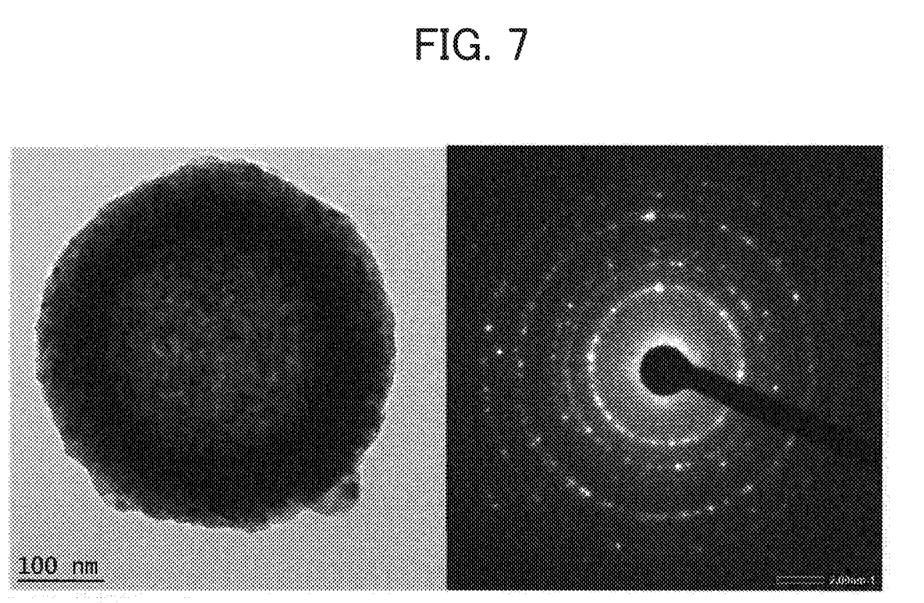
FIG. 7 is a transmission electron microscope (TEM) image of a hollow particle obtained in Comparative Example 4, and is a diagram showing an electron diffraction image of a single particle.

The same procedures were carried out as in Example 1, except that the amount of tetraethyl orthosilicate used in step 1 in Example 1 was changed from 0.1 g to 1.3 g, to obtain 1.0 g of hollow particles. The content of silica contained in the obtained hollow particle was 30.0 mol % in the $SiO_2$ conversion value. Moreover, silica contained in the hollow particles obtained was amorphous silica, and diffraction peaks derived from crystalline silica did not appear in X-ray diffraction measurements. A transmission electron microscopy (TEM) image of the obtained hollow particles, and an electron diffraction image of a single particle thereof are shown in FIG. 7. The electron diffraction image, from which no spot image was obtained, confirmed that no monocrystalline titanium oxide was contained.

A white ink of Comparative Example 4 was prepared using 0.07 g of the obtained hollow particles in the same manner as in Example 9.

[Hiding Property Test]

To each of the white inks prepared in Example 9 and Comparative Example 4, 0.02 g of a silicone-based surfactant (BYK-349 manufactured by BYK-Chemie Japan Co., Ltd.) was further added. A test specimen for hiding property test was prepared by applying the respective white inks onto a 50 mm×50 mm glass substrate by a spin coater under conditions of 800 rpm and 10 seconds, and then drying at 120° C. for 5 minutes. Diffuse reflectance of the obtained test specimen was measured using a spectrophotometer (UV-3100 manufactured by Shimadzu Corporation) and mean reflectance (%) of 380 nm to 780 nm was obtained. A larger numerical value indicates a higher hiding property. Results of the hiding property test are shown in Table 5 below.

[Sedimentation Stability Test]

The sedimentation rate (μm/s) of hollow particles in the white inks prepared in Example 9 and Comparative Example 4 was measured using a centrifugal sedimentation type dispersion stability analyzer (LUMiFuge 110 manufactured by Nippon Luft Co., Ltd.). The smaller the numerical value obtained, the better the sedimentation stability. The results of the sedimentation stability test are shown in Table 5 below.

TABLE 5

| Test result | Mean reflectance (%) | Sedimentation rate (μm/s) |
|---|---|---|
| Example 9 | 31 | 13 |
| Comparative Example 4 | 25 | 31 |

As is indicated in Table 5, the white ink of Example 9 was more excellent compared to the white ink of Comparative Example 4 in the hiding property and sedimentation stability.

The invention claimed is:

1. A hollow particle containing a mixture of titanium oxide monocrystal and silica, wherein a content of the titanium oxide is 86.0 mol % to 99.5 mol % and a content of the silica is 0.5 mol % to 14.0 mol %.

2. The hollow particle according to claim 1, wherein a primary particle diameter of the hollow particle is 10 nm to 1,000 nm.

3. The hollow particle according to claim 1, wherein a value of A/B is 0.3 to 0.95, wherein A and B represent an inner diameter and a primary particle diameter of the hollow particle, respectively.

4. The hollow particle according to claim 1, wherein a variation coefficient of the primary particle diameter is 10% or less.

5. A white ink containing the hollow particle according to claim 1, wherein the white ink is used as a coloring agent.

6. The white ink according to claim 5, wherein the white ink is an ink selected from the group consisting of aqueous inks, latex inks, solvent inks and ultraviolet curable inks.

7. An inkjet recording method, comprising ejecting droplets of the white ink according to claim 5 using an ink jet printer, wherein the droplets are attached to a recording medium.

8. A method of producing a hollow particle, comprising:
   forming a shell containing a titanium oxide precursor and a silica precursor on a surface of a template particle, which becomes a core, to obtain a core/shell particle;
   removing the template particle from the core/shell particle to obtain a shell particle; and firing the shell particle in an air atmosphere to obtain the hollow particle according to claim 1.

9. The method according to claim 8, wherein the template particle is a polymer particle.

10. The method according to claim 8, wherein the template particle is a polymer particle containing styrene as a constituent monomer.

11. The method according to claim 8, wherein the template particle is a styrene-(meth)acrylic acid polymer particle.

12. The method according to claim 8, wherein obtaining the core/shell particle is performed in the presence of a dispersant.

13. A method of producing a hollow particle, comprising:
  forming a shell containing a titanium oxide precursor and a silica precursor on a surface of a template particle which becomes a core, to obtain a core/shell particle, and
  firing the core/shell particle in an air atmosphere to remove the template particle to obtain the hollow particle according to claim 1.

\* \* \* \* \*